(12) United States Patent
Hocking et al.

(10) Patent No.: US 10,939,558 B2
(45) Date of Patent: Mar. 2, 2021

(54) RIGID RAFT

(71) Applicant: ROLLS-ROYCE plc, London (GB)

(72) Inventors: Matthew Hocking, Bristol (GB); Steven Hartley, Bristol (GB); Dean G. Jones, Bristol (GB)

(73) Assignee: ROLLS-ROYCE plc, London (GB)

( * ) Notice: Subject to any disclaimer, the term of this patent is extended or adjusted under 35 U.S.C. 154(b) by 251 days.

(21) Appl. No.: 16/047,353

(22) Filed: Jul. 27, 2018

(65) Prior Publication Data

US 2019/0045637 A1 Feb. 7, 2019

(30) Foreign Application Priority Data

Aug. 1, 2017 (GB) ..................................... 1712355

(51) Int. Cl.
| | |
|---|---|
| *H05K 3/00* | (2006.01) |
| *B29C 70/72* | (2006.01) |
| *B29C 70/86* | (2006.01) |
| *F02C 7/00* | (2006.01) |
| *H05K 1/02* | (2006.01) |
| *H05K 3/28* | (2006.01) |

(Continued)

(52) U.S. Cl.
CPC ........... *H05K 3/0067* (2013.01); *B29C 70/72* (2013.01); *B29C 70/86* (2013.01); *F02C 7/00* (2013.01); *H05K 1/0281* (2013.01); *H05K 3/285* (2013.01); *B29C 70/30* (2013.01); *B29C 70/70* (2013.01); *B29K 2105/0872* (2013.01); *B29K 2307/04* (2013.01); *B29L 2031/748* (2013.01); *B29L 2031/7504* (2013.01); *F05D 2220/32* (2013.01); *F05D 2230/60* (2013.01); *H05K 2203/1366* (2013.01); *H05K 2203/16* (2013.01)

(58) Field of Classification Search
CPC ......... B29C 70/30; B29C 70/70; B29C 70/72; B29C 70/86; B29K 2105/0872; B29K 2307/04; B29L 2031/748; B29L 2031/7504; F02C 7/00; H05K 3/0067; H05K 1/0281; H05K 3/285; F05D 2230/60

See application file for complete search history.

(56) References Cited

U.S. PATENT DOCUMENTS

| | | | | |
|---|---|---|---|---|
| 9,538,643 B2* | 1/2017 | Zizzo | ........................ | C08K 3/04 |
| 10,356,894 B2* | 7/2019 | Zizzo | ..................... | F01D 25/24 |

(Continued)

FOREIGN PATENT DOCUMENTS

| | | |
|---|---|---|
| EP | 2 422 949 A1 | 2/2012 |
| GB | 2534171 A * | 1/2016 |

(Continued)

OTHER PUBLICATIONS

Great Britain Search Report dated Jan. 16, 2018, issued in GB Patent Application No. 1712355.5.

(Continued)

*Primary Examiner* — Minh N Trinh
(74) *Attorney, Agent, or Firm* — Oliff PLC

(57) ABSTRACT

A method is provided of producing a rigid raft comprising electrical conductors enclosed in the raft. The method includes: providing a cured, composite material base layer; laying up electrical conductors on the base layer; and overlaying the laid-up electrical conductors with a cover layer, thereby producing a rigid raft in which the electrical conductors are enclosed in the raft.

11 Claims, 3 Drawing Sheets

(51) Int. Cl.
*B29L 31/00* (2006.01)
*B29C 70/30* (2006.01)
*B29C 70/70* (2006.01)
*B29K 105/08* (2006.01)
*B29K 307/04* (2006.01)

(56) References Cited

U.S. PATENT DOCUMENTS

| | | | | |
|---|---|---|---|---|
| 2007/0235209 | A1* | 10/2007 | Bailey | H01R 13/5845 |
| | | | | 174/116 |
| 2014/0327299 | A1 | 11/2014 | Broughton et al. | |
| 2019/0045637 | A1* | 2/2019 | Hocking | H05K 3/0067 |

FOREIGN PATENT DOCUMENTS

| | | |
|---|---|---|
| JP | 2014155325 | 8/2014 |
| WO | 2016148732 | 9/2016 |

OTHER PUBLICATIONS

Jun. 12, 2020 Office Action issued in European Patent Application No. 18181406.2.

* cited by examiner

RIGID RAFT

CROSS-REFERENCE TO RELATED APPLICATIONS

This specification is based upon and claims the benefit of priority from British Patent Application Number 1712355.5 filed on 1 Aug. 2017, the entire contents of which are herein incorporated by reference.

BACKGROUND

Technical Field

The present disclosure relates to a rigid raft having an electrical system embedded therein, and particularly, but not exclusively, to a gas turbine engine rigid raft.

Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

It has thus been proposed (see e.g. US 2014/327299) to embed an engine electrical system in a rigid composite material raft. Transferring electrical signals using an embedded electrical system can provide a number of advantages over transferring electrical signals using a conventional harness. For example, during assembly and in use, such rafts may provide greater protection to their electrical conductors than conventional harnesses. Further, the use of such rafts may significantly reduce the build and maintenance times of an engine, and/or reduce the possibility of errors occurring during such procedures. The rafts can also provide weight and size advantages over conventional harnesses. Similar advantages accrue when fluids are transferred using an embedded fluid system of the rigid raft and/or an embedded sensor system of the rigid raft.

Typically such rafts are manufactured by laying up pre-impregnated reinforcing fibre as a structural (base) layer, positioning an electrical harness (flexible printed circuit board (PCB) and/or wiring loom encapsulated in adhesive film) onto this base layer, and finally covering with an outer layer of pre-impregnated reinforcing fibre. This complete structure is then co-cured in an autoclave, resulting in a cured composite material raft encapsulating an electrical harness. The component can be finished off with a number of back-end processes, including machining and inspection.

However, this manufacturing process has a number of disadvantages. For example:

- Inspection of the cured raft presents a number of challenges, especially in relation to non-destructive testing (NDT). For example, it can be difficult to determine defects underneath embedded features.
- Related to this, co-curing all the pre-impregnated layers and electrical wiring harness in one procedure can be risky, as a failure during the cure can result in scrappage of the entire component.
- Co-curing generally requires the use of similar materials to prevent distortions or excess stresses being built into the raft. It thus reduces the possible range of materials options for the raft.

SUMMARY

The present disclosure provides a method of producing a rigid raft comprising electrical conductors enclosed in the raft, the method including: providing a cured, composite material base layer; laying up electrical conductors on the base layer; and overlaying the laid-up electrical conductors with a cover layer, thereby producing a rigid raft in which the electrical conductors are enclosed in the raft.

The pre-cured base layer (which may be said to be provided in a completely or fully cured state, i.e. may be completely or fully cured prior to the step of laying up electrical conductors thereon) can be inspected separately before the electrical conductors are laid-up, e.g. by NDT techniques and for compliance with dimensional requirements. This enables faster and more accurate inspection and avoids interference from the electrical conductors. In addition, as the cured base layer is a simpler structure than the finished raft, the potential for defects within the base layer (such as fibre folds or localised thickness variation due to the electrical harness) is reduced. This in turns enables thinner structures to be used, as knockdown factors accounting for material variability can be reduced. In particular, the base layer may have flat, or less highly contoured, surfaces than the finished raft. If defects are found within the pre-cured base layer, e.g. within structural plies thereof, it is significantly cheaper to reject and replace it with another part than rejecting and replacing the finished raft.

A further advantage of the method is that there is more scope to customise the cover layer when it is manufactured separately from the base layer. Thus the method provides increased capability to incorporate components in and alter the visual appearance of the cover layer.

The method may have any one or, to the extent that they are compatible, any combination of the following optional features.

The base layer can be bought in as a cured, composite material article, or can be manufactured preliminary to performing the method, e.g. by laying up and curing pre-impregnated, fibre reinforced composite material.

The method may further include: machining the cured, composite material base layer before the electrical conductors are laid-up thereon.

The method may further include: inspecting the cured, composite material base layer for defects before the electrical conductors are laid-up thereon.

The composite material of the base layer, when cured, may be formed of rigid composite material containing layers of continuous reinforcing fibres. The rigid composite material may comprise any suitable combination of resin and fibre as desired for a particular application. Any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon). Typically, the composite material of the base layer is a carbon fibre reinforced composite material.

The laid-up electrical conductors may be overlaid with a composite material cover layer. Typically such a cover layer is uncured when overlaid. In this case, the method may further include: curing the cover layer to bond the cover layer to the base layer, thereby producing a rigid raft in which the electrical conductors are enclosed in the raft by being embedded in composite material. Like the base layer, the composite material of the cover layer, when cured, may be formed of rigid composite material containing layers of continuous reinforcing fibres. Thus the composite material of the cover layer may comprise any suitable combination of resin and fibre as desired for a particular application. For example, the fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon). However, typically the composite material of the cover layer is a carbon fibre reinforced composite material. The uncured, composite material of the cover layer may conveniently be a pre-impregnated, fibre reinforced composite material.

According to another option, however, the laid-up electrical conductors may be overlaid with a non-composite protective cover layer. Typically such a cover layer may be a polymeric or elastomeric protective cover layer. In this case, the polymeric or elastomeric protective cover may be spray coated onto the laid-up electrical conductors.

The electrical conductors may be electrically conductive wires, e.g. surrounded by electrically insulating sleeves. However, preferably, the electrical conductors may comprise flexible printed circuit boards. Providing the electrical conductors as tracks in a flexible printed circuit may allow the size of the resulting electrical raft to be reduced further and/or substantially minimized. For example, many different electrical conductors may be laid into a flexible printed circuit in close proximity, thereby providing a compact structure. The flexible substrate of a single flexible printed circuit may provide electrical and/or mechanical protection/isolation to a large number of electrical conductors.

Electrical connectors and/or sockets may be laid up on the base layer and joined to the electrical conductors when the electrical conductors are laid up. The electrical connectors and/or sockets may allow electrical connection of the rigid raft to other electrical components, for example to other rigid rafts (either directly or indirectly, via an electrical cable or lead) or to electrical units (again, either directly or indirectly, via an electrical cable or lead). Such electrical connectors and/or sockets may take any suitable form, and may be at least partially embedded in the rigid raft.

The rigid raft may be part of an electrical system of a gas turbine engine.

It will be appreciated that the enclosed conductors in the finished raft may be said to be embedded in the rigid material of the rigid raft. Such embedded electrical conductors (which may be as embedded electrical wires or conductive tracks in a flexible printed circuit embedded in the rigid material) may be described as being fixed in position by the rigid material, for example relative to the rest of the rigid raft. It will also be appreciated that the embedded electrical conductors may be said to be surrounded by the rigid material and/or buried in the rigid material and/or integral with (or integrated into) the rigid material.

Accordingly, the present disclosure also provides a method of assembling a gas turbine engine comprising: producing a rigid raft comprising electrical conductors enclosed in the raft as described and/or claimed herein; mechanically attaching the produced raft to the rest of the gas turbine engine (for example to a structural component of the gas turbine engine, such as a compressor casing, turbine casing or fan casing); and electrically connecting the rigid raft to the gas turbine engine such that the electrical conductors are electrically connected at least one other electrical component of the gas turbine engine.

Accordingly, the produced rigid raft may form a part of an electrical harness of a gas turbine engine.

BRIEF DESCRIPTION OF THE DRAWINGS

Embodiments of the present disclosure will now be described by way of example with reference to the accompanying drawings in which.

DETAILED DESCRIPTION OF THE DISCLOSURE

Figure 1:
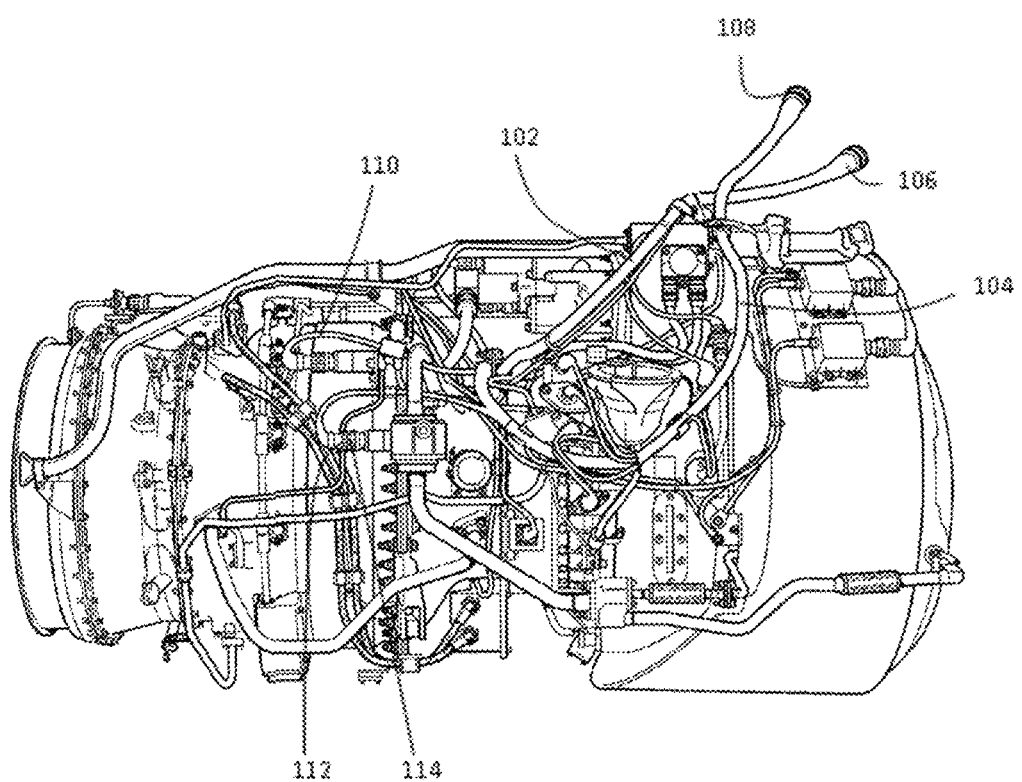
FIG. 1 shows a gas turbine engine with a conventional harness.
Figure 2:
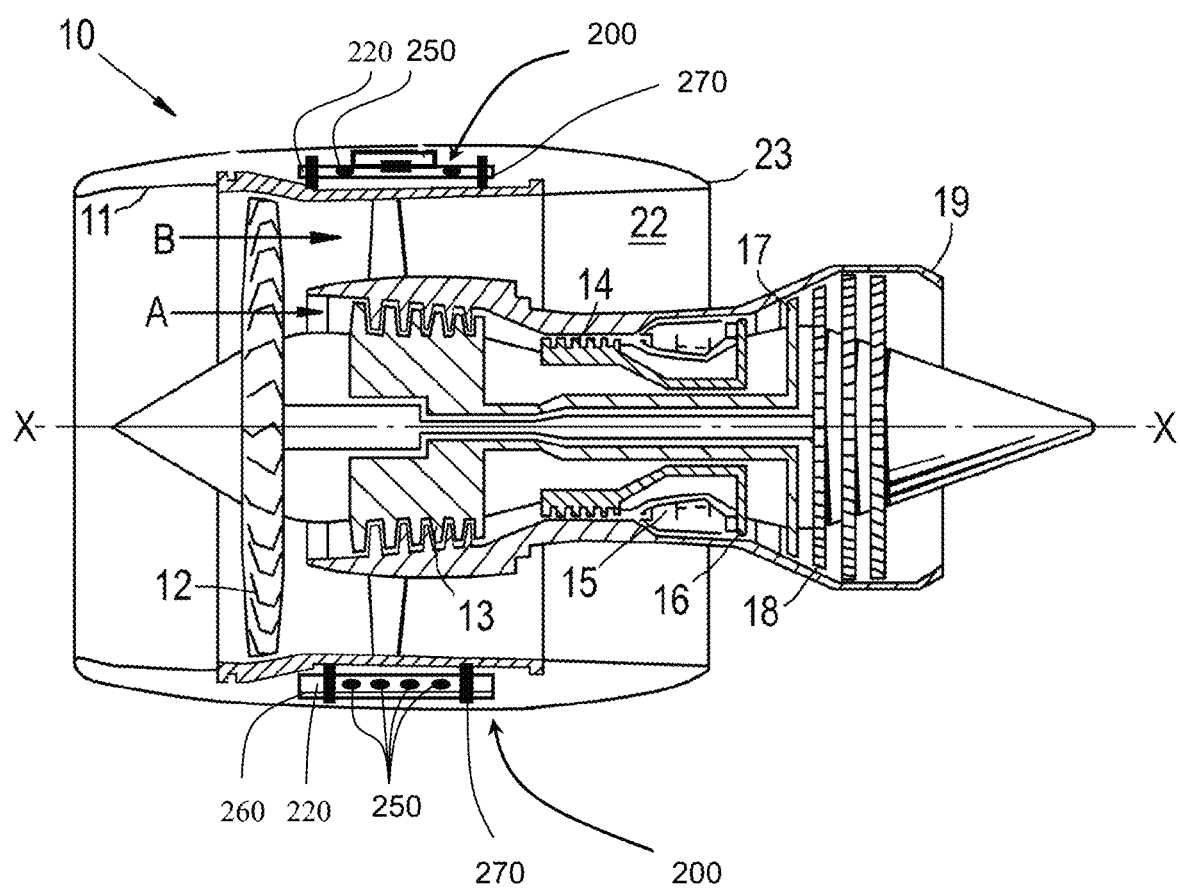
FIG. 2 shows a longitudinal cross-section through a ducted fan gas turbine engine.

With reference to FIG. 2, a ducted fan gas turbine engine is generally indicated at 10 and has a principal and rotational axis X-X. The engine comprises, in axial flow series, an air intake 11, a propulsive fan 12, an intermediate pressure compressor 13, a high-pressure compressor 14, combustion equipment 15, a high-pressure turbine 16, an intermediate pressure turbine 17, a low-pressure turbine 18 and a core engine exhaust nozzle 19. A nacelle 21 generally surrounds the engine 10 and defines the intake 11, a bypass duct 22 and a bypass exhaust nozzle 23.

During operation, air entering the intake 11 is accelerated by the fan 12 to produce two air flows: a first air flow A into the intermediate-pressure compressor 13 and a second air flow B which passes through the bypass duct 22 to provide propulsive thrust. The intermediate-pressure compressor 13 compresses the air flow A directed into it before delivering that air to the high-pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines respectively drive the high and intermediate-pressure compressors 14, 13 and the fan 12 by suitable interconnecting shafts.

Other gas turbine engines to which the present disclosure may be applied may have alternative configurations. By way of example such engines may have an alternative number of interconnecting shafts (e.g. two) and/or an alternative number of compressors and/or turbines. Further the engine may comprise a gearbox provided in the drive train from a turbine to a compressor and/or fan.

The gas turbine engine 10 shown in FIG. 2 has two rigid electrical rafts 200. The rigid rafts may be used to transmit/transfer electrical signals (or electricity, including electrical power and/or electrical control signals) around the engine and/or to/from the engine from other components, such as components of an airframe.

In FIG. 2, each rigid raft 200 comprises one or more electrical conductors embedded in a composite material 220. The electrical conductors may be provided in the form of a harness, which may be a flexible PCB 250.

The rigid rafts 200 may further have electrically conductive grounding or screen layers 260. The rigid rafts may further have mounting fixtures for attaching the respective raft to a mounting structure 270 (such as an anti-vibration mount). Although not shown in FIG. 2, the rigid rafts may further have embedded fluid systems and/or an embedded sensor systems.

FIGS. 3A to 3D show schematically stages in the production of one of the rigid rafts 200.

Figure 3A:
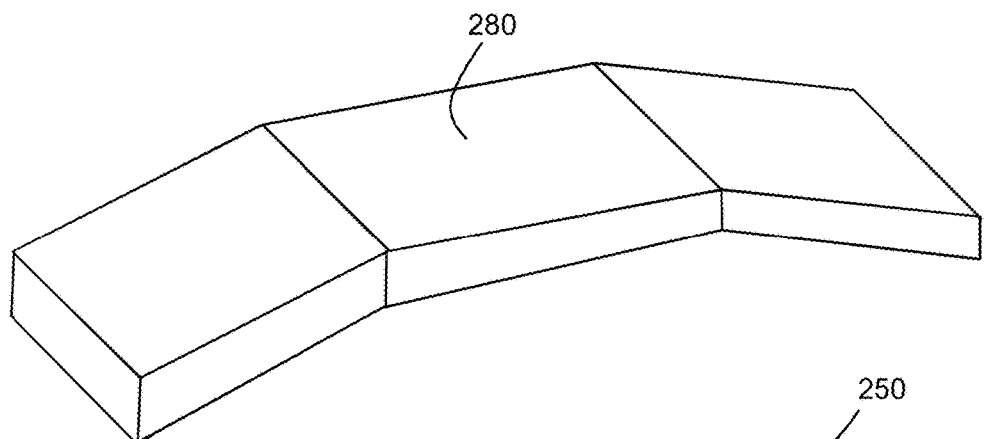
FIGS. 3A to 3D show schematically stages in the production of a rigid electrical raft of the engine of FIG. 2.

FIG. 3A shows a pre-cured, composite material (e.g. carbon fibre reinforced epoxy resin) base layer 280 that can advantageously be bought in from an external source. The base layer is structural and self-supporting, and facetted so as to allow it to partially wrap around the fan case of the engine 10. NDT (e.g. ultrasonic testing) is performed on the base layer to look for internal defects such as voids and fibre folds. The base layer is also controlled for dimensional accuracy. The flat surfaces of the facetted shape facilitate the performance of the NDT. Also the NDT is unhindered by subsequent additions to the base layer. If the base layer has defects or does not comply to specification, it can be rejected at this stage and replaced.

Figure 3B:
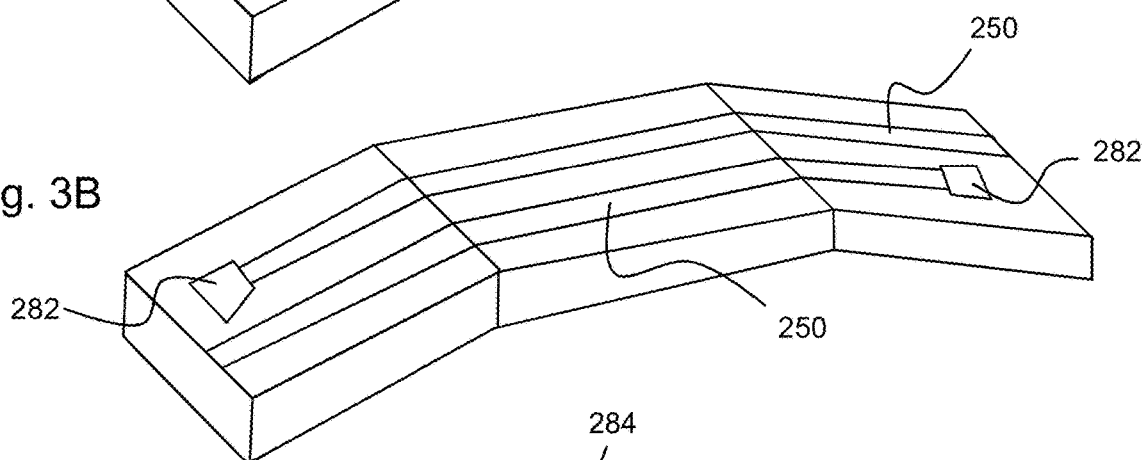
Figure 3C:
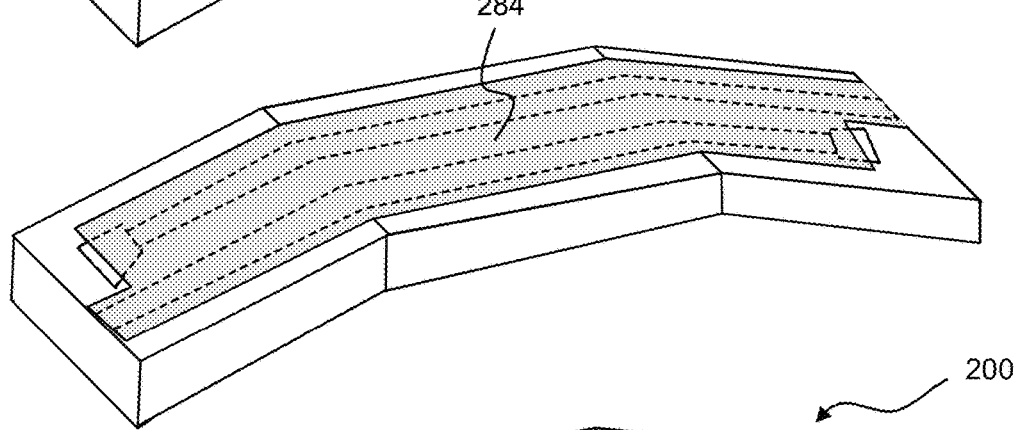
Figure 3D:
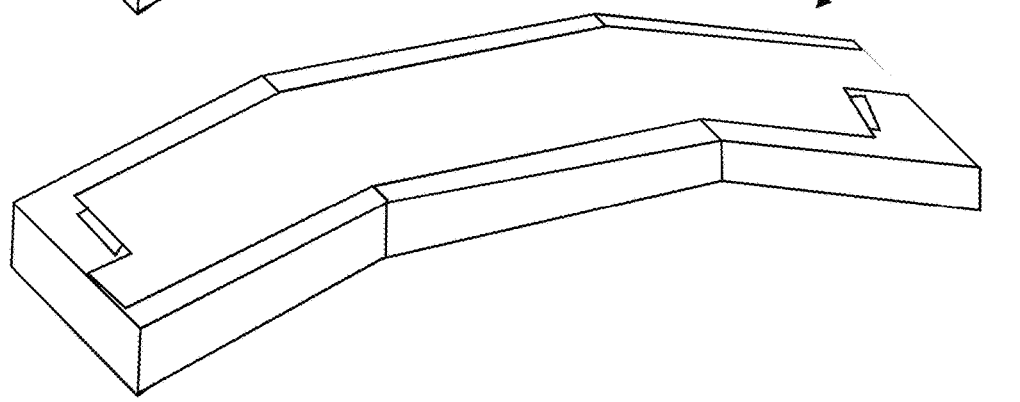

If the base layer 280 requires any machining, this can conveniently be performed before the next stage of the production, which as shown in FIG. 3B is the laying up of flexible PCBs 250 on the base layer. The PCBs may be joined to electrical connectors 282 for electrically connecting the circuitry of the PCBs to other electrical devices.

Next, a pre-impregnated, composite material (e.g. again carbon fibre reinforced epoxy resin) cover layer 284 is laid over the PCBs 250 and partially over the connectors 282 so that they may still be connected to the other electrical devices. This cover layer is then cured, for example by autoclaving, resulting in the finished rigid raft 200 shown in FIG. 3D. The cover layer provides an opportunity to customize the raft, for example by the inclusion of components which can be co-bonded with the cover layer 284.

However, as an alternative approach to overlaying the PCBs 250 and the connectors 282 with a composite material cover layer, they may be overlaid instead with a non-composite polymeric or elastomeric protective cover layer, e.g. by spray coating. This alternative approach results in the PCBs and the connectors being enclosed in the raft by virtue of being sandwiched between the composite material of the base layer 280 and the non-composite cover layer.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

We claim:

1. A method of producing a rigid raft comprising electrical conductors enclosed in the raft, the method including:
   providing a cured, composite material base layer;
   subsequent to the providing the cured, composite base layer, laying up electrical conductors on the base layer; and
   overlaying the electrical conductors with a cover layer, thereby producing the rigid raft in which the electrical conductors are enclosed in the raft,
   wherein the electrical conductors comprise one or more flexible printed circuit boards and
   wherein the rigid raft is part of an electrical system of a gas turbine engine.

2. The method according to claim 1 further including:
   machining the cured, composite material base layer before the electrical conductors are laid-up thereon.

3. The method according to claim 1 further including:
   inspecting the cured, composite material base layer for defects before the electrical conductors are laid-up thereon.

4. The method according to claim 1, wherein the composite material of the base layer is a carbon fiber reinforced composite material.

5. The method according to claim 1, wherein:
the electrical conductors are overlaid with an uncured, composite material cover layer, and
the method further includes: curing the cover layer to bond the cover layer to the base layer, thereby producing the rigid raft in which the electrical conductors are enclosed in the rigid raft by being embedded in composite material.

6. The method according to claim 5, wherein the composite material of the cover layer is a carbon fiber reinforced composite material.

7. The method according to claim 5, wherein the uncured, composite material of the cover layer is a pre-impregnated, fiber reinforced composite material.

8. The method according to claim 1, wherein the method further comprises:
overlaying the electrical conductors with a non-composite polymeric or elastomeric protective cover layer.

9. The method according to claim 8, wherein the method further comprises spray coating polymeric or elastomeric protective cover onto the electrical conductors.

10. A method of assembling a gas turbine engine comprising:
producing a rigid raft comprising electrical conductors enclosed in the raft, the producing the rigid raft comprising:
providing a cured, composite material base layer;
subsequent to the providing the cured, composite base layer, laying up electrical conductors on the base layer; and
overlaying the electrical conductors with a cover layer, thereby producing the rigid raft in which the electrical conductors are enclosed in the raft,
wherein the electrical conductors comprise one or more flexible printed circuit boards and
wherein the rigid raft is part of an electrical system of the gas turbine engine;
mechanically attaching the produced raft to a structural component of the gas turbine engine; and
electrically connecting the rigid raft to the gas turbine engine such that the electrical conductors are electrically connected at least one other electrical component of the gas turbine engine.

11. The method of assembling a gas turbine engine according to claim 10, wherein the rigid raft forms part of an electrical harness of the gas turbine engine.

* * * * *